United States Patent [19]

Beckwith et al.

[11] Patent Number: 5,196,805
[45] Date of Patent: Mar. 23, 1993

[54] DISTRIBUTED DIFFERENTIAL AMPLIFIER ARRANGEMENT

[75] Inventors: William B. Beckwith; Warren L. Seely, both of Chandler, Ariz.

[73] Assignee: Motorola, Inc., Schaumburg, Ill.

[21] Appl. No.: 828,623

[22] Filed: Jan. 31, 1992

[51] Int. Cl.$^5$ .............................................. H03F 3/60
[52] U.S. Cl. ............................... 330/54; 330/277; 330/53
[58] Field of Search ................. 330/54, 53, 277, 253, 330/252

[56] References Cited

U.S. PATENT DOCUMENTS

| | | | |
|---|---|---|---|
| 3,218,569 | 11/1965 | Beck. | |
| 4,668,920 | 5/1987 | Jones | 330/53 |
| 4,675,911 | 6/1987 | Sokolov et al. | 370/54 |
| 4,918,447 | 4/1990 | Michel | 341/144 |
| 5,034,696 | 7/1991 | Campagnie | 330/253 |
| 5,060,298 | 10/1991 | Waugh et al. | 330/54 |

Primary Examiner—Robert J. Pascal
Assistant Examiner—Tan Dinh
Attorney, Agent, or Firm—Frank J. Bogacz

[57] ABSTRACT

A N-stage differential distributed amplifier arrangement. The differential distributed amplifier arrangement includes a parallel connection of N-differential amplifiers. The inputs to the amplifiers are delayed so that the same input is received by each amplifier in sequence at a slightly later time than the preceding amplifier. The outputs of each amplifier are also delayed so that the output of the previous amplifier is added to the output of the next sequential amplifier. Thereby the output is an amplified version of the input. By appropriate grounding of inputs or outputs the differential distributed amplifier arrangement may convert from balanced signals to single-ended signals, from single-ended signals to balanced signals or from two inputs to two outputs.

14 Claims, 2 Drawing Sheets

DISTRIBUTED DIFFERENTIAL AMPLIFIER ARRANGEMENT

BACKGROUND OF THE INVENTION

The present invention pertains to broadband communications and more particularly to microwave monolithic integrated circuit (MMIC) amplifiers/baluns used in such communication systems.

Baluns are used in communication systems. Baluns may be used to convert RF signals from an unbalanced configuration, such as in a microstrip, to a balanced configuration. Such amplifiers/baluns may be used to drive mixer diodes, for example. MMIC 180° hybrids are well suited for these implementations. However, broadband MMIC 180° hybrids are difficult to realize because they are either too large in the physical sense to be realized in MMIC form or the output is too narrow in bandwidth to be useful.

Such baluns typically convert: 1) one input signal (unbalanced) to two output signals (balanced), 180° out-of-phase; 2) two input signals, 180° out-of-phase, to one output signal; and 3) two input signals to two output signals.

Simple distributed transmission lines implemented with vacuum tubes are well-known. However, such distributed transmission line circuits typically provide only one input and only one output.

Further distributed amplifier transmission line circuits have been developed. In such distributed amplifier transmission line circuits field effect transistors are employed. The gate and drain capacitances of these field effect transistors are used in conjunction with inductors to simulate transmission lines. Such circuits result in a transmission line which provides gain to the input signal. However, these circuits have only one input and one output.

Thus the circuits are not suitable for balanced signal applications.

It would be highly desirable to have a transmission line circuit for balanced-to-unbalanced conversion or unbalanced-to-balanced conversion in which a number of inputs and outputs may be handled and is suitable for implementation in MMIC-type design.

SUMMARY OF THE INVENTION

In accordance with the present invention, a novel differential distributed amplifier arrangement is shown.

A differential distributed amplifier arrangement includes at least one amplifier stage. The arrangement includes input apparatus adapted to receive at least one input signal for amplification and output apparatus coupled to the input apparatus and adapted to provide at least one output signal which is an amplified version of the input signal.

Each amplifier stage includes an amplifier which is coupled to the input apparatus and produces the amplified signal. The amplifier stage also includes transmitting apparatus which transmits the amplified signal to the output arrangement. The transmitting arrangement is coupled between the amplifier and the output arrangement. The output arrangement provides the output signal in response to the amplified signal output by the amplifier.

DESCRIPTION OF THE PREFERRED EMBODIMENT

Figure 1:
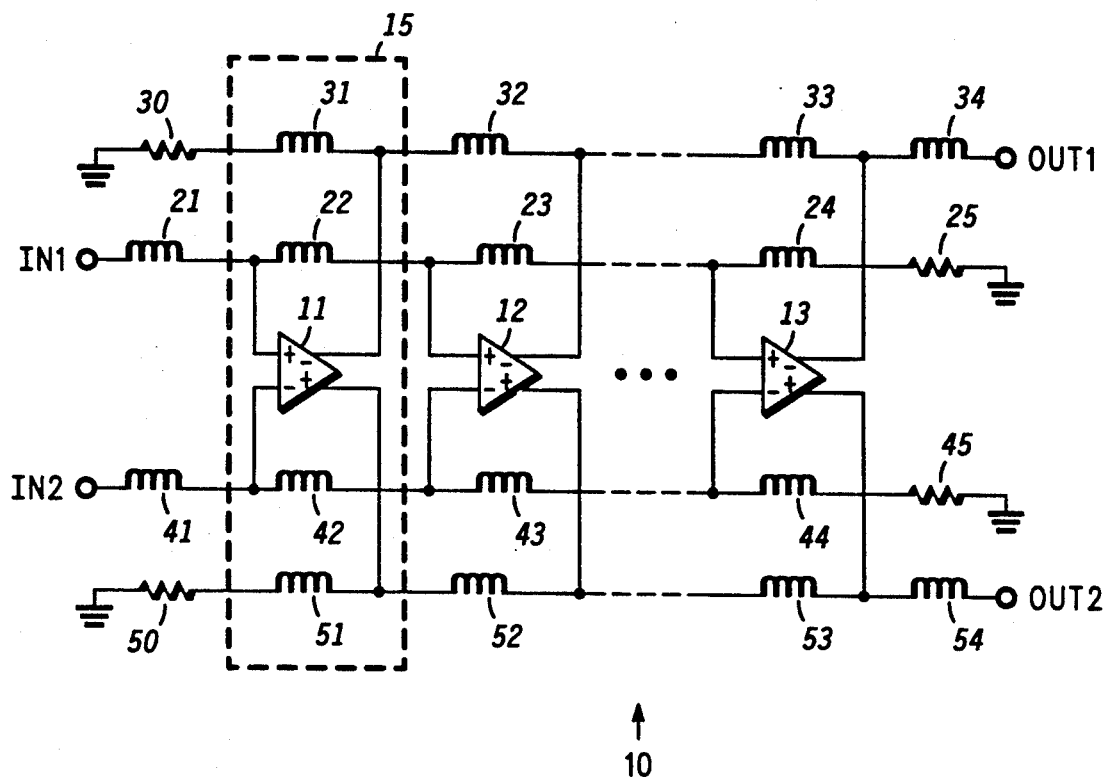
FIG. 1 is a schematic diagram of a differential distributed amplifier arrangement in accordance with the present invention.

Referring to FIG. 1 an embodiment of a differential distributed amplifier arrangement 10 is shown. Differential amplifiers 11, 12, and 13 are coupled in parallel to one another. Two inputs are provided, IN1 and IN2. The input signal on lead IN1 is connected through inductor 21 to one input of differential amplifier 11. Similarly, the input signal on IN2 is connected through inductor 41 to another input of differential amplifier 11. The inputs of differential amplifier 11 are 180° out-of-phase as indicated by the plus (+) and minus (−) signs on the inputs. The common connection of inductor 21 and differential amplifier is also connected to inductor 22 which is also connected to an input of differential amplifier 12. Similarly, the common connection of inductor 41 and differential amplifier 11 is connected to inductor 42 which is also connected to another input of differential amplifier 12.

Resistor 30 is connected between ground and inductor 31. Inductor 31 is connected to an output of differential amplifier 11. Inductor 32 is connected to the common connection of inductor 31 and differential amplifier 11. Similarly, resistor 50 is connected between ground and inductor 51. The other output of differential amplifier 11 is connected to inductor 51. The common connection of differential amplifier 11 and inductor 51 is connected to inductor 52.

As can be seen from FIG. 1, the first stage 15 of the differential distributed amplifier arrangement 10 includes inductors 31, 22, 42, and 51 and differential amplifier 11. A second differential amplifier stage comprises inductors 32, 23, 43, and 52 and differential amplifier 12. As many stages as are desirable and practical may be included. Each stage will increase the gain of the output signals OUT1 and OUT2.

The last stage comprises inductors 33, 24, 44, and 53 and differential amplifier 13. The next to last inductor, in this case inductor 32, is connected to inductor 33 which is connected to inductor 34. The output of amplifier 13 is connected to inductor 33. The common connection of amplifier 13 and inductor 33 is connected through inductor 34 to OUT1, which is the first output. Inductor 23 is connected to the next to last inductor, in this case inductor 22. Inductor 23 and inductor 24 are also connected to the first input of amplifier 13. The common connection of inductors 23 and amplifier 13 is connected through inductor 24 and resistor 25 to ground. Inductor 43 is connected to the next to last inductor, in this case inductor 42. In addition, inductor 43 and inductor 44 are connected to another input of amplifier 13. The common connection of amplifier 13 and inductor 43 is connected through inductor 44, through resistor 45 to ground. Inductor 53 is connected to the inductor of the next to last stage, in this case inductor 52. Inductor 53 is connected to another output of amplifier 13. The common connection of differential amplifier 13 and inductor 53 is connected through inductor 54 to provide another output, OUT2.

For a MMIC implementation of a broadband balun, in which a "single-ended" (unbalanced) input is to produce two outputs (balanced), each 180° out-of-phase with the other output, lead IN2 is terminated to ground. The input signal is applied at lead IN1. The output signals produced at terminals OUT1 and OUT2 are amplified versions of the input signal applied to IN1 except that the two output signals on leads OUT1 and OUT2 are substantially 180° out-of-phase. Those skilled in the art will realize that either input may be resistively loaded and the other input provide the unbalanced input signal.

For the second MMIC implementation of a broadband 180° hybrid mixer, two input signals, each 180° out-of-phase are input to leads IN1 and IN2. The output OUT2 is terminated to a resistive load. The remaining output signal on the OUT1 lead is an amplified and combined version of the two input signals on leads IN1 and IN2. Those skilled in the art will realize that either output may be resistively loaded and the other output provide the unbalanced output signal.

For the third possible configuration of an MMIC implemented broadband balanced amplifier, two inputs and two outputs are desired. Two input signals are applied to the IN1 and IN2 leads respectively. Two signals are provided by the OUT1 and OUT2 leads. The signals on the OUT1 and OUT2 leads correspond and are amplified versions of the signals applied to the IN1 and IN2 leads. The signals are 180° out-of-phase.

In operation, an input signal is applied to terminal IN1. It is delayed through inductor 21 before being transmitted to amplifier 11. This signal is inverted and output by amplifier 11 to inductors 31 and 32. The input signal on terminal IN1 is further delayed by inductor 22 before being transmitted to amplifier 12. Inductor 32 delays the output of amplifier 11 so that the output of amplifier 12 is produced at the same time the output signal of amplifier 11 is transmitted through inductor 32. At the common connection of the output amplifier 12 and inductor 32, the output of amplifier 11 is added to the output of amplifier 12. Thereby, more gain is achieved. Similarly, inductor 23 delays the input signal which is applied to differential amplifier 13. Further, the output signals of differential amplifiers 11 and 12 which have been added after inductor 32 are transmitted through inductor 33. These added signals are delayed by inductor 33. Differential amplifier 13 amplifies the signal input from inductor 23 and transmits the amplified version to the common connection of amplifier 13, inductor 33, and inductor 4. Again, the output of amplifier 13 is added to the outputs of amplifiers 11 and 12 at the junction of inductors 33 and 34 with amplifier 13. The combined output signal is then delayed by inductor 34 and produced at terminal OUT1 as the resultant amplified output signal. The input signal is also transmitted from inductor 23 through inductor 24 and resistor 25 to ground.

In a single-ended configuration IN2 would be connected to ground. In addition, the output produced at terminal OUT2 would be 180° out-of-phase with the output produced at terminal OUT1. The input signals at terminal IN1 are cross-coupled through amplifiers 11, 12, and 13. For the output signal produced at terminal OUT2, the summing occurs at the common connection of inductors 51 and 52 with the output of amplifier 11. Another summation is made at the common connection of amplifier 12, inductor 52 and inductor 53. Lastly, a summation is made at the common connection of inductor 53, inductor 54, and amplifier 13. The signal produced at OUT2 is 180° out-of-phase with the signal produced at OUT1. The signals are substantially equal in magnitude.

In the differential distributed amplifier arrangement shown in FIG. 1, three stages are shown. Stage 15 is one stage, for example. This amplifier may contain from one to N-stages. As many stages as are practical may be utilized for an implementation. The gain and ripple of a particular implementation will depend upon the number of stages employed and the bandwidth desired.

In a balanced-to-single-ended arrangement, one of the outputs OUT1 or OUT2 would be set resistively terminated. Signals 180° out-of-phase with respect to one another would be applied to the input terminals IN1 and IN2. The resultant signal output at either terminal OUT1 or terminal OUT2 is the combined signal with respect to the inputs IN1 and IN2 and in-phase. Again, the output signal has been amplified.

For a four-port balanced amplifier, two signals 180° out-of-phase are put into terminals IN1 and IN2 respectively and amplified output versions are produced at output terminals OUT1 and OUT2. The signals at terminals OUT1 and OUT2 are 180° out-of-phase.

As can be seen from the above, the distributed differential amplifier arrangement is suitable for implementation on an integrated circuit. In addition, this circuit arrangement is suitable for implementation which operates at high microwave frequencies. Therefore, the resulting circuit is especially adapted for use in monolithic microwave integrated circuitry (MMIC) which may implemented on as little as a single 60 mils × 120 mils die.

Figure 2:
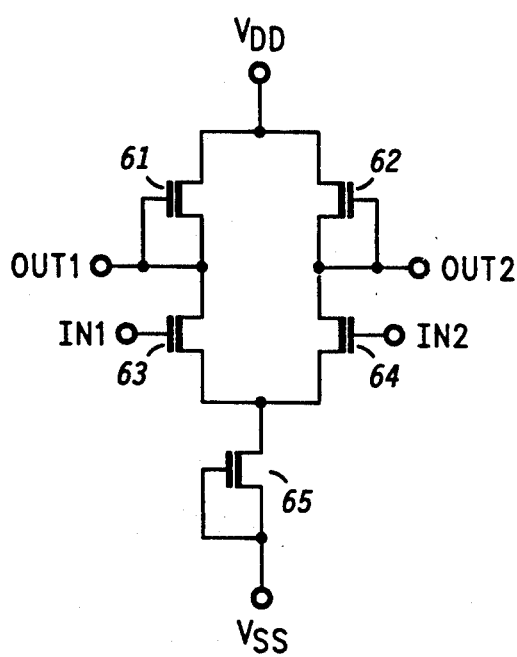
FIG. 2 is an embodiment of a differential amplifier in accordance with the present invention.

Referring for FIG. 2, a preferred embodiment of a differential amplifier such as items 11, 12, or 13 is shown. The differential amplifier is implemented with five FETs (field effect transistors) 61-65. FETs 61, 62, and 65 are current sources. FETs 61, 62, and 65 provide a relatively high RF impedance at lower frequencies where inductors typically would be required and prohibitive because of their physically large size. FETs 61 and 62 have their drain connected in common to a voltage $V_{DD}$. The gate of FET 61 is connected to the source of FET 61 and to the drain of FET 63. Similarly, the gate of FET 62 is connected to the source of FET 62 and to the drain of FET 64. Output OUT1 is provided at the common connection of FETs 61 and 63 and output OUT2 is provided at the common connection of FETs 62 and 64. The sources of FETs 63 and 64 are connected in common to the drain of FET 65. The gate and source of FET 65 are connected in common to voltage source $V_{SS}$. The circuit inputs IN1 and IN2 comprise the gate inputs to FETs 63 and 64 respectively. The circuit of FIG. 2 may be substituted for each of the amplifiers 11-13 of FIG. 1. Each of the amplifiers of FIG. 1 comprise differential amplifier stages connected in a distributed amplifier architecture.

The FETs of FIG. 2 may be implemented using gallium arsenide (GaAs) metal semiconductor field effect transistors (MESFET) or high electron mobility transistor (HEMT) or heterostructure bipolar transistor (HBT) or other suitable transconductance devices with high frequency capabilities.

Figure 3:
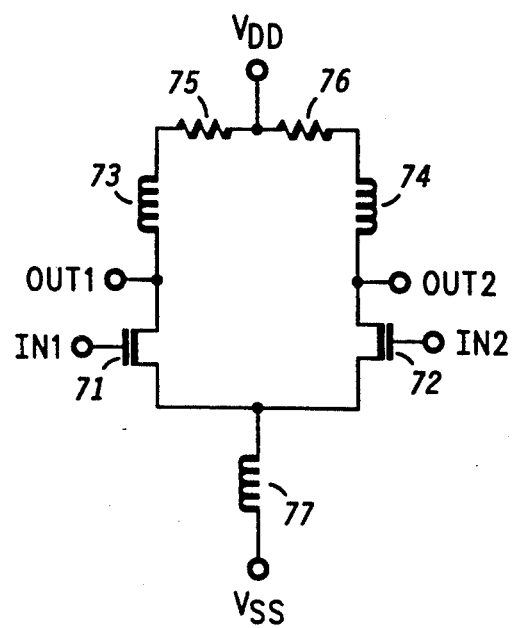
FIG. 3 is another embodiment of a differential amplifier in accordance with the present invention.

Referring to FIG. 3, another preferred embodiment of the differential amplifiers 11-13 is shown. At higher frequencies, the active current sources of FIG. 2 may be replaced by inductors. However, if the inductors are physically large, the resonant frequencies of the inductors will fall within the frequency band of the amplifier. In FIG. 3, FETs 71 and 72 are shown having their sources connected in common to inductor 77 which is connected in turn to source of voltage $V_{SS}$. The inputs IN1 and IN2 comprise the gate inputs to FETs 71 and 72 respectively. Inductor 73 and resistor 75 are connected in series between the drain of FET 71 and voltage source $V_{DD}$. Similarly, inductor 74 and resistor 76 are connected in series between the drain of FET 72 and the voltage source $V_{DD}$. The outputs OUT1 and OUT2 are provided at the common connections of FET 71 and inductor 73 and FET 72 and inductor 74, respectively.

Figure 4:
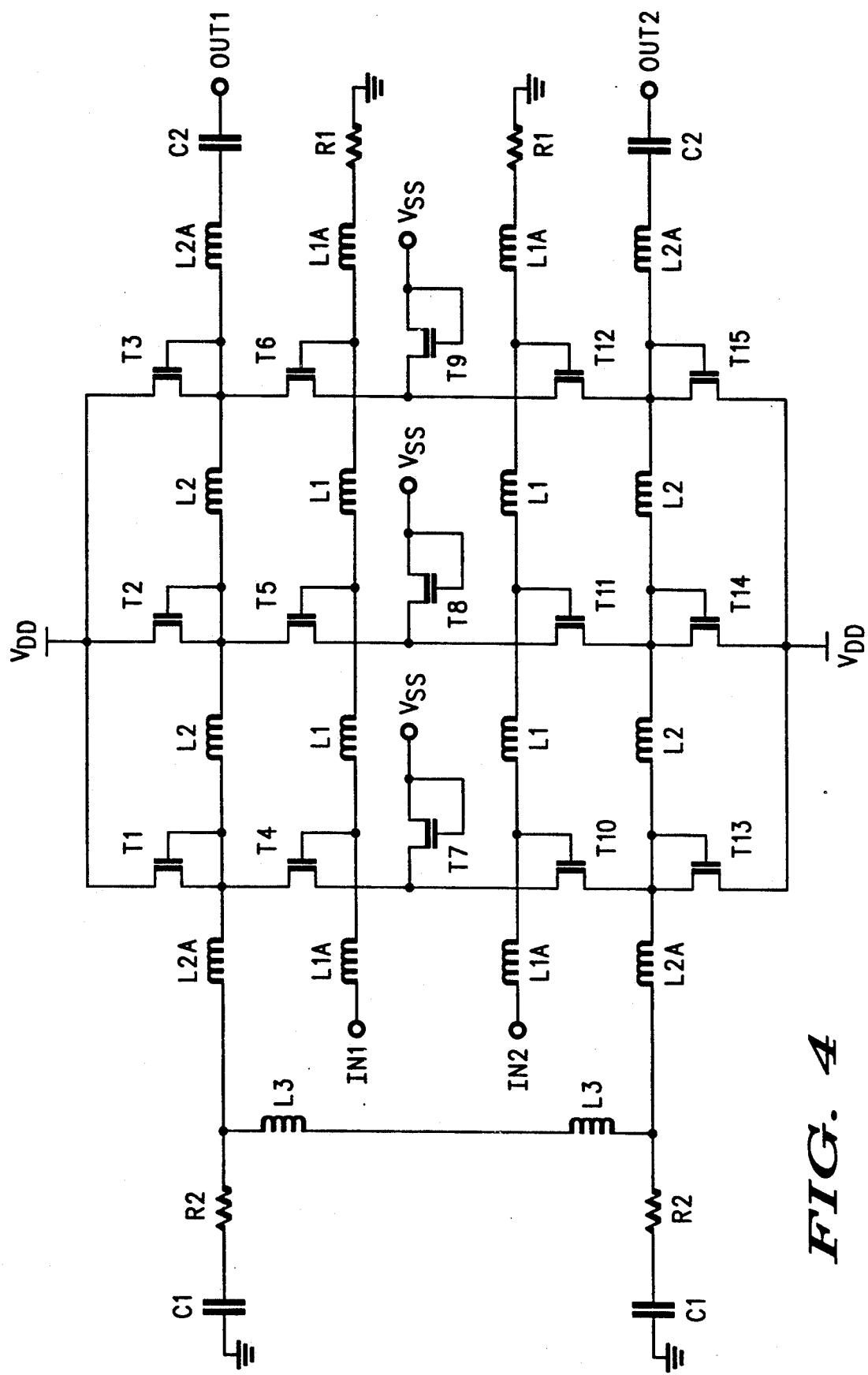
FIG. 4 is a schematic diagram of another embodiment of the differential distributed amplifier arrangement in accordance with the present invention.

Referring to FIG. 4, another preferred embodiment of the present differential distributed amplifier arrangement is shown. The differential distributed amplifier arrangement shown in FIG. 4 is for an approximately 50 ohm application and operates in the frequency range of from 1 to 6 gHz. Transistors T1, T2, and T3 are connected in parallel, having their drains connected to voltage source $V_{DD}$ and their sources and gates coupled together through inductors of value L2. Transistors T4, T5, and T6 are coupled respectively to the sources of transistors T1, T2, and T3. The gates of transistors T4, T5, and T6 are coupled together through inductors of value L1.

Input terminal IN1 is coupled through an inductor of value L1A to the gate of T4 and an inductor of value L1. The drain of transistors T7, T8, and T9 are respectively coupled to the sources of transistors T4, T5, and T6. Transistors T7, T8, and T9 operate as current sources. The gates and sources of transistor T7, T8, and T9 are interconnected and connected to voltage source $V_{SS}$.

Transistors T10, T11, and T12 are coupled in parallel through inductors of value L1. Input terminal IN2 is coupled through inductor of value L1A to the inductor of value L1. The sources of transistors T10, T11, and T12 are connected respectively to the sources of transistors T4, T5, and T6. The drains of transistors T13, T14, and T15 are connected in common to source of voltage $V_{DD}$. The drain and gates of T13, T14, and T15 are connected together and coupled via inductors of value L2. The source of transistors T13, T14, and T15 are respectively coupled to the drains T10, T11, and T12. A network comprising a serial connection of a capacitor of value C1, a resistor of value R2, an inductor of value L2A are coupled between ground and the source of transistor T1. Similarly, a network having the same values is connected between ground and the common connection of transistors T10 and T13. Two inductors serially connected of value L3 interconnect the two networks between the resistors of value R2.

TABLE 1

| Component | Value |
|---|---|
| L1 | = .715 nh. |
| L1A | = .107 nh. |
| L2 | = 1.22 nh. |
| L2A | = .620 nh. |
| L3 | = 2.06 nh. |
| C1 | = 7.53 pf. |
| C2 | = 4.78 pf. |
| R1 | = 29.5 ohms. |

TABLE 1-continued

| Component | Value |
|---|---|
| R2 | = 57.1 ohms. |

Networks of serially connected inductor of value L1A and resistor R1 are connected between ground and the gates of transistors T6 and T12. A network including a serially connected inductor value L2A and capacitor of value C2 is connected to the drain of transistor T12. The other connection of this network provides the output OUT2. Similarly, a network comprising a serially connected inductor and capacitor of the values mentioned above is connected to the drain of transistor T6. The other connection of this network provides the output OUT1. A novel differential distributed amplifier arrangement has been shown. The reader should appreciate the advantages of this configuration of differential amplifiers coupled in a distributed architecture to provide for a four-port balanced amplifier which is suitable for implementation on small integrated circuits such as monolithic microwave integrated circuits. Further, the bandwidth of this circuit is greatly increased over conventional balun or 180° hybrid arrangements.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A differential distributed amplifier arrangement including at least one amplifier stage, said differential distributed amplifier arrangement comprising:

input means adapted to receive at least one input signal for amplification;

output means coupled to said input means, said output adapted to provide at least one output signal which is an amplified signal of said at least one input signal;

said at least one amplifier stage including:

amplifier means coupled to said input means said amplifier means producing said amplified signal; and means for transmitting said amplified signal to said output means, said means for transmitting coupled between said amplifier means and said output means; and said output means provides said at least one output signal in response to said amplified signal;

said at least one amplifier stage includes a plurality of amplifier stages including a previous amplifier stage and a next amplifier stage, said previous and next amplifier stages coupled in parallel, said each amplifier stage coupled to said input means and to said output means;

each of said plurality of amplifier stages includes said amplifier means and said means for transmitting; said means for transmitting including means for adding coupled to said amplifier means, said means for adding said amplified signal of said previous amplifier stage with said amplified signal of said next amplifier stage;

each of said amplifier means includes:

first and second voltage sources;

first and second transistor means, each coupled to said first voltage source, each of said first and second transistor means providing for an output;

third and fourth transistor means coupled respectively to said first and second transistor means and coupled in common, said third and fourth transistor means each providing for an input; and fifth transistor means coupled to the common connection of said third and fourth transistor means and to said second voltage source; and wherein said means for transmitting includes a plurality of serially connected inductor means, said means for adding being coupled between each of said plurality of inductor means; and said serial connection of inductor means connected to resistive means, said resistive means connected between one of said inductor means and a source of electrical ground; and wherein each of said transistor means includes field effect transistor means; and wherein said field effect transistor means each include high electron mobility transistors.

2. A differential distributed amplifier arrangement as claimed in claim 1, wherein:

said amplifier means includes a plurality of inputs; and said input means including a plurality of serially connected inductor means, said inputs of said amplifier means each being connected between corresponding ones of said plurality of serially connected inductor means.

3. A differential distributed amplifier arrangement as claimed in claim 2, wherein said input means further includes resistor means connected between one of said serially connected inductor means and a source of electrical ground.

4. A differential distributed amplifier arrangement as claimed in claim 1, wherein said at least one amplifier stage includes a plurality of amplifier stages in the range of from 1 to N amplifier stages, wherein N is an integer.

5. A differential distributed amplifier arrangement as claimed in claim 1, wherein each of said field effect transistor means includes metal semiconductor field effect transistors (MESFETs).

6. A differential distributed amplifier arrangement as claimed in claim 1, wherein said field effect transistor means each include heterostructure bipolar transistor (HBTs).

7. A differential distributed amplifier arrangement as claimed in claim 6, wherein each of said first and second transistor means includes field effect transistor (FET) means.

8. A differential distributed amplifier arrangement as claimed in claim 6, wherein each of said field effect transistor means includes metal semiconductor field effect transistors (MESFETs).

9. A differential distributed amplifier arrangement as claimed in claim 1, wherein:

said input means receiving first and second input signals, said first signal being an electrical ground signal, said second signal being a single-ended input signal; and said output means providing first and second output signals, said first and second output signals being of substantially equal magnitude and substantially opposite in phase forming a balanced output.

10. A differential distributed amplifier arrangement as claimed in claim 1, wherein:

said input means receiving first and second input signals equal in amplitude and 180° out-of-phase; and said output means providing first and second output signals, said first output signal being connected to a source of electrical ground, said second output signal being a single-ended output signal.

11. A differential distributed amplifier arrangement as claimed in claim 1, wherein:

said input means receives first and second input signals; and said output means provides first and second output signals which are amplified versions of said first and second input signals.

12. A differential distributed amplifier arrangement as claimed in claim 1, wherein said differential distributed amplifier arrangement comprises a microwave monolithic integrated circuit arrangement.

13. A differential distributed amplifier arrangement including at least one amplifier stage, said differential distributed amplifier arrangement comprising:

input means adapted to receive at least one input signal for amplification;

output means coupled to said input means, said output adapted to provide at least one output signal which is an amplified signal of said at least one input signal;

said at least one amplifier stage including:

amplified means coupled to said input means said amplifier means producing said amplified signal; and means for transmitting said amplified signal to said output means, said means for transmitting coupled between said amplifier means and said output means; and said output means provides said at least one output signal in response to said amplified signal;

said at least one amplifier stage includes a plurality of amplifier stages including a previous amplifier stage and a next amplifier stage, said previous and next amplifier stages coupled in parallel, said each amplifier stage coupled to said input means and to said output means;

each of said plurality of amplifier stages includes said amplifier means and said means for transmitting; said means for transmitting including means for adding coupled to said amplifier means, said means for adding said amplified signal of said previous amplifier stage with said amplified signal of said next amplifier stage;

each of said amplifier means includes:

first and second voltage sources;

first and second resistor means having a common connection with said first voltage source;

first and second inductor means coupled respectively to said first and second resistor means;

first and second transistor means coupled respectively to said first and second inductor means, said common connection of said first and second transistor means and said first and second inductor means each providing an output, said first and second transistor means further coupled together in common, said first and second transistor means each providing an input; and third inductor means coupled between the common connection of said first and second transistor means and said second voltage source.

14. A differential distributed amplifier arrangement as claimed in claim 12, wherein said differential distributed amplifier arrangement comprises a microwave monolithic integrated circuit arrangement.

* * * * *